(12) United States Patent
Huang et al.

(10) Patent No.: US 11,854,458 B2
(45) Date of Patent: Dec. 26, 2023

(54) DRIVING CIRCUIT CONNECTING FIRST CONTROL VOLTAGE TERMINAL AND SECOND VOLTAGE CONTROL TERMINAL, DRIVING METHOD, SHIFT REGISTER AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Weiyun Huang, Beijing (CN); Tianyi Cheng, Beijing (CN); Meng Li, Beijing (CN); Binyan Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/754,763

(22) PCT Filed: Apr. 27, 2021

(86) PCT No.: PCT/CN2021/090155
§ 371 (c)(1),
(2) Date: Apr. 11, 2022

(87) PCT Pub. No.: WO2022/226765
PCT Pub. Date: Nov. 3, 2022

(65) Prior Publication Data
US 2022/0343828 A1 Oct. 27, 2022

(51) Int. Cl.
*G09G 3/20* (2006.01)
*G11C 19/28* (2006.01)
*G09G 3/32* (2016.01)

(52) U.S. Cl.
CPC ............. *G09G 3/2092* (2013.01); *G09G 3/32* (2013.01); *G09G 2310/0286* (2013.01); *G09G 2310/08* (2013.01); *G11C 19/28* (2013.01)

(58) Field of Classification Search
CPC ................... G09G 3/2092; G09G 3/32; G09G 2310/0286; G09G 2310/08; G11C 19/28
See application file for complete search history.

(56) References Cited

U.S. PATENT DOCUMENTS 10,629,108 B2 4/2020 Xuan
2013/0328495 A1 12/2013 Woo et al.
(Continued)

FOREIGN PATENT DOCUMENTS

CN 105185318 A 12/2015
CN 208141796 U 11/2018
(Continued)

*Primary Examiner* — Adam J Snyder
(74) *Attorney, Agent, or Firm* — McCoy Russell LLP

(57) ABSTRACT

The present disclosure provides a driving circuit, a driving method, a shift register and a display device. The drive circuit includes a first control circuit, a second control circuit, a first output circuit, a second output circuit and an output terminal; the first control circuit is configured to connect or disconnect the first node and the first control voltage terminal under the control of a control signal provided by the control terminal; the second control circuit is configured to connect or disconnect the second node and the second control voltage terminal under the control of the control signal.

19 Claims, 8 Drawing Sheets

(56) References Cited

U.S. PATENT DOCUMENTS

| | | | |
|---|---|---|---|
| 2016/0351160 A1* | 12/2016 | In | G09G 3/3266 |
| 2017/0110050 A1* | 4/2017 | Park | G09G 3/3266 |
| 2017/0186363 A1* | 6/2017 | Park | G09G 3/3266 |
| 2017/0287423 A1 | 10/2017 | Yang et al. | |
| 2018/0114500 A1* | 4/2018 | Jung | G09G 3/3266 |
| 2020/0168160 A1* | 5/2020 | Oh | G09G 3/3266 |
| 2020/0202785 A1 | 6/2020 | Yang et al. | |
| 2020/0294461 A1 | 9/2020 | Xu et al. | |
| 2021/0193007 A1 | 6/2021 | Cheng et al. | |
| 2021/0256913 A1 | 8/2021 | Hao et al. | |

FOREIGN PATENT DOCUMENTS

| | | |
|---|---|---|
| CN | 110211539 A | 9/2019 |
| CN | 110675803 A | 1/2020 |
| CN | 209980755 U | 1/2020 |
| CN | 110956919 A | 4/2020 |
| CN | 111445832 A | 7/2020 |
| CN | 111477179 A | 7/2020 |
| CN | 111477181 A | 7/2020 |
| CN | 111524486 A | 8/2020 |
| CN | 111696459 A | 9/2020 |
| CN | 111739473 A | 10/2020 |
| KR | 20130137860 A | 12/2013 |

* cited by examiner

DRIVING CIRCUIT CONNECTING FIRST CONTROL VOLTAGE TERMINAL AND SECOND VOLTAGE CONTROL TERMINAL, DRIVING METHOD, SHIFT REGISTER AND DISPLAY DEVICE

CROSS REFERENCE TO RELATED APPLICATION

The present application is a U.S. National Phase of International Application No. PCT/CN2021/090155 entitled "DRIVING CIRCUIT, DRIVING METHOD, SHIFT REGISTER AND DISPLAY DEVICE," and filed on Apr. 27, 2021. The entire contents of the above-listed application are hereby incorporated by reference for all purposes.

TECHNICAL FIELD

The present disclosure relates to the field of display technology, and more particularly to a driving circuit, a driving method, a shift register and a display device.

BACKGROUND

In the related art, when the display device is driven at a low frequency, in a maintenance phase, when the clock signal terminal for output in the driving circuit provides a low voltage signal, a first output transistor in a first output circuit in the driving circuit and a second output transistor in a second output circuit in the driving circuit are turned off. Since the first output transistor and the second output transistor are under voltage stress for a long time, the characteristic drift of the first output transistor and the characteristic drift of the second output transistor will occur, so that the potential of the driving signal provided by the driving circuit cannot be maintained at the first voltage, resulting in abnormal driving of the driving circuit.

SUMMARY

A first aspect of the present disclosure provides a driving circuit, including a first control circuit, a second control circuit, a first output circuit, a second output circuit and an output terminal; wherein the first output circuit is electrically connected to a first node, a first clock signal terminal and the output terminal, and is configured to connect or disconnect the output terminal and the first clock signal terminal under the control of a potential of the first node; the second output circuit is electrically connected to a second node, the output terminal and a first voltage terminal, and is configured to connect or disconnect the output terminal and the first voltage terminal under the control of a potential of the second node; the first control circuit is electrically connected to a control terminal, the first node and a first control voltage terminal, and is configured to connect or disconnect the first node and the first control voltage terminal under the control of a control signal provided by the control terminal; the second control circuit is electrically connected to the control terminal, the second node and a second control voltage terminal, and is configured to connect or disconnect the second node and the second control voltage terminal under the control of the control signal.

Optionally, the first control circuit includes a first control transistor; a control electrode of the first control transistor is electrically connected to the control terminal, a first electrode of the first control transistor is electrically connected to the first control voltage terminal, and a second electrode of the first control transistor is electrically connected to the first node.

Optionally, the second control circuit comprises a second control transistor; a control electrode of the second control transistor is electrically connected to the control terminal, a first electrode of the second control transistor is electrically connected to the second control voltage terminal, and a second electrode of the second control transistor is electrically connected to the second node.

Optionally, the first output circuit includes a first output transistor and the second output circuit includes a second output transistor, a control electrode of the first output transistor is electrically connected to the first node, a first electrode of the first output transistor is electrically connected to the first clock signal terminal, and a second electrode of the first output transistor is electrically connected to the output terminal; a control electrode of the second output transistor is electrically connected to the second node, a first electrode of the second output transistor is electrically connected to the first voltage terminal, and a second electrode of the second output transistor is electrically connected to the output terminal.

Optionally, the driving circuit further includes a third node control circuit, a second node control circuit, a fourth node control circuit, a sixth node control circuit and a first node control circuit, wherein, the third node control circuit is electrically connected to a first clock signal terminal, a second clock signal terminal, an input terminal and a third node, and is configured to connect or disconnect the third node and the input terminal under the control of a first clock signal provided by the first clock signal terminal and a second clock signal provided by the second clock signal terminal; the second node control circuit is electrically connected to the second node, a second voltage terminal, a fourth node, a third clock signal terminal and a control node, and is configured to control to connect or disconnect the control node and the second voltage terminal under the control of a potential of the fourth node, and control to connect or disconnect the control node and the third clock signal terminal under the control of a potential of the second node, and control the potential of the second node according to the potential of the control node; the fourth node control circuit is electrically connected to the first voltage terminal, the second clock signal terminal, the fourth node and the third node, and is configured to control to connect or disconnect the fourth node and the first voltage terminal under the control of the second clock signal, and control to connect or disconnect the fourth node and the second clock signal terminal under the control of a potential of the third node; the sixth node control circuit is electrically connected to a fifth node, a third clock signal terminal and a sixth node, and is configured to control to connect or disconnect the sixth node and the third clock signal terminal under the control of a potential of the fifth node, and control a potential of the sixth node according to the potential of the fifth node; the first node control circuit is electrically connected to the sixth node, the third clock signal terminal, the first node, the second node and the first clock signal terminal, and configured to control to connect or disconnect the sixth node and the first node under the control of a third clock signal provided by the third clock signal terminal, and control to connect or disconnect the first node and the first clock signal terminal under the control of the potential of the second node, and control the potential of the first node according to the first clock signal.

Optionally, the third node and the second node are a same node; or, the driving circuit further includes a first on-off control circuit, the first on-off control circuit is electrically connected to the third node, the second node and the first voltage terminal, configured to control to connect the third node and the second node under the control of the first voltage signal provided by the first voltage terminal.

Optionally, the fourth node and the fifth node are a same node; or, the driving circuit further includes a second on-off control circuit, the second on-off control circuit is electrically connected to the fourth node, the fifth node and the first voltage terminal, the second on-off control circuit is configured to control to connect the fourth node and the fifth node under the control of the first voltage signal provided by the first voltage terminal.

Optionally, the first node control circuit comprises a first transistor, a second transistor and a first capacitor; a control electrode of the first transistor is electrically connected to the third clock signal terminal, a first electrode of the first transistor is electrically connected to the sixth node, and a second electrode of the first transistor is electrically connected to the first node; a control electrode of the second transistor is electrically connected to the second node, a first electrode of the second transistor is electrically connected to the first clock signal terminal, and a second electrode of the second transistor is electrically connected to the first node; a first terminal of the first capacitor is electrically connected to the first node, and a second terminal of the first capacitor is electrically connected to the first clock signal terminal; the second node control circuit includes a third transistor, a fourth transistor and a second capacitor, a control electrode of the third transistor is electrically connected to the second node, a first electrode of the third transistor is electrically connected to the third clock signal terminal, and a second electrode of the third transistor is electrically connected to the control node; a control electrode of the fourth transistor is electrically connected to the fourth node, a first electrode of the fourth transistor is electrically connected to the second voltage terminal, and a second electrode of the fourth transistor is electrically connected to the control node; a first terminal of the second capacitor is electrically connected to the second node, and a second terminal of the second capacitor is electrically connected to the control node.

Optionally, the third node control circuit includes a fifth transistor and a sixth transistor, the fourth node control circuit includes a seventh transistor and an eighth transistor, and the sixth node control circuit includes a ninth transistor and a third capacitor; a control electrode of the fifth transistor is electrically connected to the first clock signal terminal, and a first electrode of the fifth transistor is electrically connected to the input terminal; a control electrode of the sixth transistor is electrically connected to the second clock signal terminal, a first electrode of the sixth transistor is electrically connected to a second electrode of the fifth transistor, and a second electrode of the sixth transistor is electrically connected electrically connected to the third node; a control electrode of the seventh transistor is electrically connected to the second clock signal terminal, a first electrode of the seventh transistor is electrically connected to the first voltage terminal, and a second electrode of the seventh transistor is electrically connected to the fourth node; a control electrode of the eighth transistor is electrically connected to the third node, a first electrode of the eighth transistor is electrically connected to the second clock signal terminal, and a second electrode of the eighth transistor is electrically connected to the fourth node; a control electrode of the ninth transistor is electrically connected to the fifth node, a first electrode of the ninth transistor is electrically connected to the third clock signal terminal, and a second electrode of the ninth transistor is electrically connected to the sixth node; a first terminal of the third capacitor is electrically connected to the fifth node, and a second terminal of the third capacitor is electrically connected to the sixth node.

In a second aspect, a driving method is applied to the driving circuit, wherein a driving period includes a driving phase and a maintenance phase; the driving method includes: in the driving phase, the first clock signal terminal providing a first clock signal, and the driving circuit outputting a driving signal through the first output circuit and the second output circuit; the first control circuit controlling to disconnect the first node and the first control voltage terminal under the control of a control signal provided by the control terminal, and the second control circuit controlling to disconnect the second node and the second control voltage terminal under the control of the control signal; in at least part of the maintenance phase, the first clock signal terminal providing a first voltage signal; in the at least part of the maintenance phase, the first control circuit controlling to connect the first node and the first control voltage terminal under the control of the control signal provided by the control terminal, and the second control circuit controlling to connect the second node and the second control voltage terminal under the control of the control signal.

Optionally, the driving method further includes: in the at least part of the maintenance phase, both the first control voltage terminal and the second control voltage terminal providing a valid voltage signal.

Optionally, the at least part of the maintenance phase includes a first time period and a second time period that are set in sequence, and the driving method further includes: in the first time period, the first control voltage terminal providing a valid voltage signal, and the second control voltage terminal providing an invalid voltage signal; in the second time period, the first control voltage terminal providing an invalid voltage signal, and the second control voltage terminal providing a valid voltage signal; or, in the first time period, the first control voltage terminal providing an invalid voltage signal, and the second control voltage terminal providing a valid voltage signal; in the second time period, the first control voltage terminal providing a valid voltage signal, and the second control voltage terminal provides an invalid voltage signal.

Optionally, the at least part of the maintenance phase includes at least two maintenance stages set in sequence, and each maintenance stage includes a third time period and a fourth time period set in sequence; the driving method further includes: in the third time period, the first control voltage terminal providing a valid voltage signal, and the second control voltage terminal providing an invalid voltage signal; in the fourth time period, the first control voltage terminal providing an invalid voltage signal, and the second control voltage terminal providing a valid voltage signal; or, in the third time period, the first control voltage terminal providing an invalid voltage signal, and the second control voltage terminal providing a valid voltage signal; in the fourth time period, the first control voltage terminal providing a valid voltage signal, and the second control voltage terminal providing an invalid voltage signal.

Optionally, the step of the first clock signal terminal providing a first voltage signal in the at least part of the maintenance phase includes: in part of the maintenance phase, the first clock signal terminal providing the first voltage signal; the driving method further includes: in a time period other than the part of the maintenance phase in the maintenance phase, the first control circuit controlling to disconnect the first node and the first control voltage terminal under the control of the control signal provided by the control terminal, the second control circuit controlling to disconnect the second node and the second control voltage terminal under the control of the control signal.

In a third aspect, an embodiment of the present disclosure provides a shift register including a plurality of levels of driving circuits.

In a fourth aspect, an embodiment of the present disclosure provides a display device including the shift register.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative efforts shall fall within the protection scope of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor other than the control electrode, one electrode is called the first electrode, and the other electrode is called the second electrode.

In actual operation, when the transistor is a triode, the control electrode may be the base electrode, the first electrode may be the collector, and the second electrode may be the emitter; or the control electrode may be the base electrode, the first electrode can be an emitter, and the second electrode can be a collector.

In actual operation, when the transistor is a thin film transistor or a field effect transistor, the control electrode may be a gate electrode, the first electrode may be a drain electrode, and the second electrode may be a source electrode. The control electrode may be a gate electrode, the first electrode may be a source electrode, and the second electrode may be a drain electrode.

Figure 1:
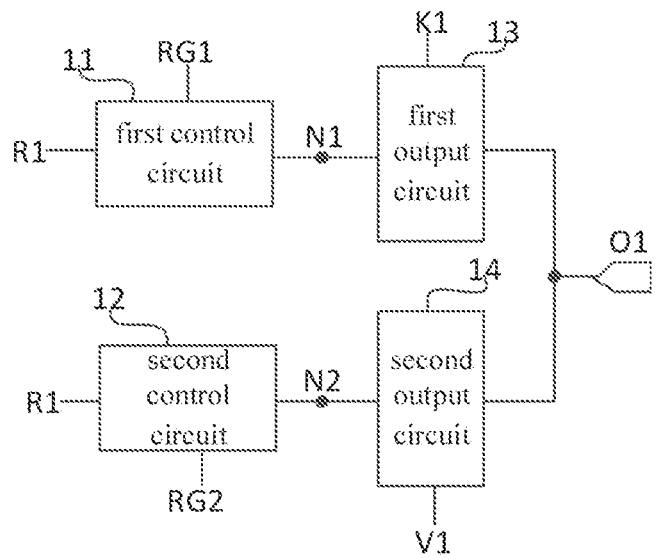
FIG. 1 is a structural diagram of a driving circuit according to an embodiment of the present disclosure.

As shown in FIG. 1, the driving circuit according to the embodiment of the present disclosure includes a first control circuit 11, a second control circuit 12, a first output circuit 13, a second output circuit 14, and an output terminal O1;

The first output circuit 13 is electrically connected to a first node N1, a first clock signal terminal K1 and the output terminal O1, and is configured to connect or disconnect the output terminal O1 and the first clock signal terminal K1 under the control of a potential of the first node N1;

The second output circuit 14 is electrically connected to a second node N2, the output terminal O1 and a first voltage terminal V1, and is configured to connect or disconnect the output terminal O1 and the first voltage terminal V1 under the control of a potential of the second node N2;

The first control circuit 11 is electrically connected to a control terminal R1, the first node N1 and a first control voltage terminal RG1, and is configured to connect or disconnect the first node N1 and the first control voltage terminal RG1 under the control of a control signal provided by the control terminal R1;

The second control circuit 12 is electrically connected to the control terminal R1, the second node N2 and a second control voltage terminal RG2, and is configured to connect or disconnect the second node N2 and the second control voltage terminal RG2 under the control of the control signal.

The driving circuit described in at least one embodiment of the present disclosure may be included in a shift register, and the shift register may be applied to a display device. The shift register may be used to provide a gate driving signal or a light emitting control signal, but this is not limited.

In a specific implementation, when the display device is driven at a low frequency, a driving period may include a driving phase and a maintenance phase. During the driving phase, the plurality of stages of driving circuits included in the shift register output driving signals in sequence; during the maintenance phase, the plurality of stages of driving circuits included in the shift register unit all output the first voltage signal.

In at least one embodiment of the present disclosure, when the driving circuit is used to provide a gate driving signal, when a transistor in the pixel circuit in the display device whose the control electrode is connected to the gate driving signal is an n-type transistor, the first voltage signal is a low voltage signal, when the transistor in the pixel circuit in the display device whose gate electrode is connected to the gate driving signal is a p-type transistor, the first voltage signal may be is a high voltage signal;

When the driving circuit is used to provide a light-emitting control signal, and the transistor in the pixel circuit in the display device whose control electrode is connected to the light-emitting control signal is an n-type transistor, the first voltage signal may be a low voltage signal, when the transistor in the pixel circuit in the display device whose control electrode is connected to the light-emitting control signal is a p-type transistor, the first voltage signal may be a high voltage signal.

In at least one embodiment of the present disclosure, the first voltage signal is taken as a low voltage signal for example.

When performing low-frequency driving (for example, 1 Hz), the duration of the driving period may be 60 frames, the duration of the driving phase may be 1 frame, and the duration of the maintenance phase may be 59 frames, the maintenance phase may be a Vertical Blank.

Figure 2:
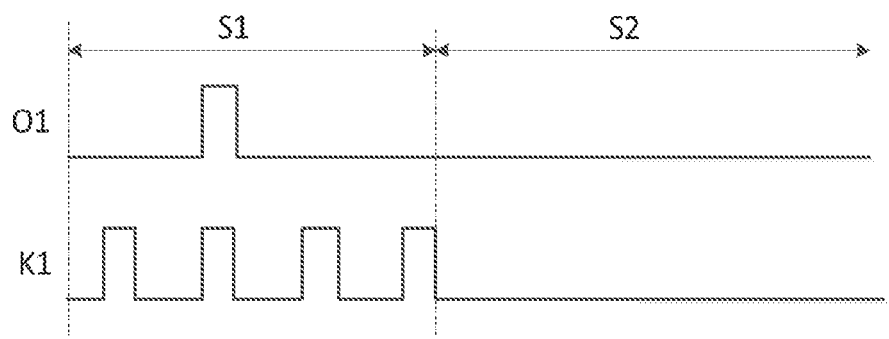
FIG. 2 is a working timing diagram of the driving circuit according to the embodiment of the present disclosure.

As shown in FIG. 2, in one case, in a corresponding stage of output time period in the driving phase S1, the potential of the driving signal outputted by O1 is a high voltage, and K1 provides the first clock signal; in the maintenance phase S2, O1 outputs a low voltage signal, K1 continuously provides low voltage signal, which can save power consumption.

Figure 3:
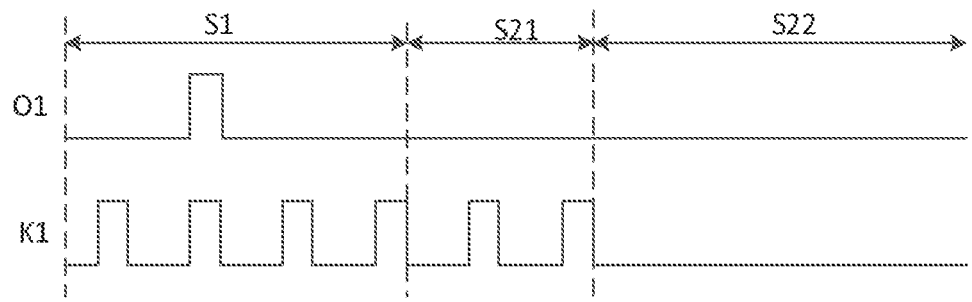
FIG. 3 is another working timing diagram of the driving circuit according to the embodiment of the present disclosure.

As shown in FIG. 3, in another case, in a corresponding stage of output time period in the driving phase S1, the potential of the driving signal outputted by O1 is a high voltage, and K1 provides the first clock signal; the maintenance phase S2 includes the first maintenance time period S21 and second maintenance time period S22; in the first maintenance time period S21, K1 provides the first clock signal, and in the second maintenance time period S22, K1 continuously provides a low voltage signal to save power consumption.

In the related art, in the maintenance phase S2, when K1 provides a low voltage signal, since the first output transistor in the first output circuit 13 and the second output transistor in the second output circuit 14 are under voltage stress for a long time, it will cause the characteristics drift of the first output transistor and the characteristics drift of the second output transistor, so that the potential of the driving signal cannot be maintained at the first voltage, resulting in abnormal driving of the driving circuit. Based on this, the driving circuit according to at least one embodiment of the present disclosure adopts the first control circuit 11 and/or the second control circuit 12, so that in the maintenance phase S2, when K1 continues to provide a low voltage signal, and the potential of the driving signal is not the first voltage signal, the driving signal can be restored to the first voltage signal through the control of the first control circuit 11 and/or the second control circuit 12 to ensure the operation stability of the driving circuit.

Optionally, the first control circuit includes a first control transistor;

A control electrode of the first control transistor is electrically connected to the control terminal, a first electrode of the first control transistor is electrically connected to the first control voltage terminal, and a second electrode of the first control transistor is electrically connected to the first node.

Optionally, the second control circuit includes a second control transistor;

A control electrode of the second control transistor is electrically connected to the control terminal, a first electrode of the second control transistor is electrically connected to the second control voltage terminal, and a second electrode of the second control transistor is electrically connected to the second node.

Optionally, the first output circuit includes a first output transistor, and the second output circuit includes a second output transistor, wherein, A control electrode of the first output transistor is electrically connected to the first node, a first electrode of the first output transistor is electrically connected to the first clock signal terminal, and a second electrode of the first output transistor is electrically connected to the output terminal;

A control electrode of the second output transistor is electrically connected to the second node, a first electrode of the second output transistor is electrically connected to the first voltage terminal, and a second electrode of the second output transistor is electrically connected to the output terminal.

Figure 4:
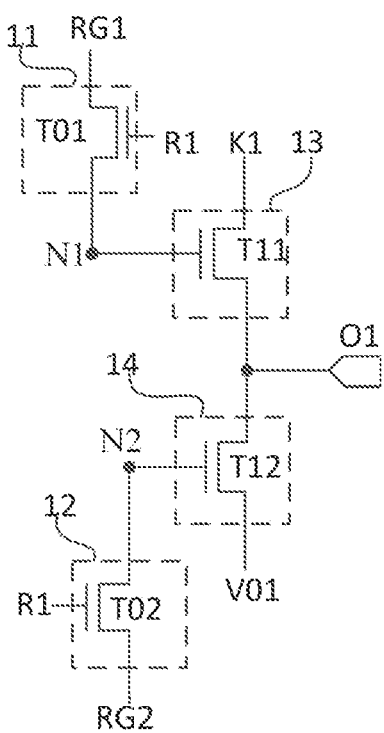
FIG. 4 is a circuit diagram of a driving circuit according to at least one embodiment of the present disclosure.

As shown in FIG. 4, based on at least one embodiment of the driving circuit shown in FIG. 1, the first control circuit 11 includes a first control transistor T01;

The gate electrode of the first control transistor T01 is electrically connected to the control terminal R1, the source electrode of the first control transistor T01 is electrically connected to the first control voltage terminal RG1, and the drain electrode of the first control transistor T01 is electrically connected to the first node N1;

The second control circuit 12 includes a second control transistor T02;

The gate electrode of the second control transistor T02 is electrically connected to the control terminal R1, the source electrode of the second control transistor T02 is electrically connected to the second control voltage terminal RG2, and the drain electrode of the second control transistor T02 is electrically connected to the second node N2;

The first output circuit 13 includes a first output transistor T11, and the second output circuit includes a second output transistor T12, wherein, The gate electrode of the first output transistor T11 is electrically connected to the first node N1, the source electrode of the first output transistor T11 is electrically connected to the first clock signal terminal K1, and the drain electrode of the first output transistor T11 is electrically connected to the output terminal O1;

The gate electrode of the second output transistor T12 is electrically connected to the second node N2, the source electrode of the second output transistor T12 is electrically connected to the low voltage terminal V01, and the drain electrode of the second output transistor T12 is electrically connected to the output terminal O1.

In at least one embodiment of the driving circuit shown in FIG. 4, the first voltage terminal may be the low voltage terminal V01, and each transistor is a p-type thin film transistor, but not limited thereto.

Figure 5:
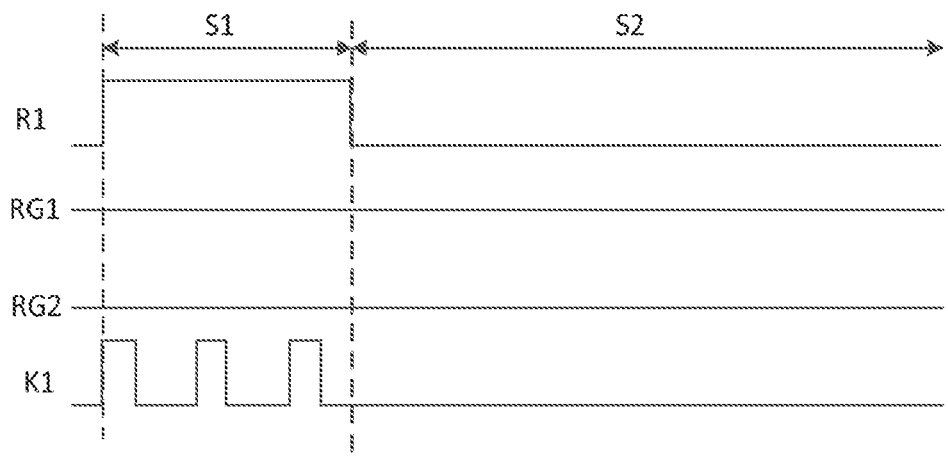
FIG. 5 is a working timing diagram of the driving circuit shown in FIG. 4 according to at least one embodiment of the present disclosure.

When at least one embodiment of the driving circuit shown in FIG. 4 of the present disclosure is in operation, as shown in FIG. 5, the driving period includes a driving phase S1 and a maintenance phase S2 that are set in sequence;

In the driving phase S1, R1 provides a high voltage signal, RG1 and RG2 provide a low voltage signal, both T01 and T02 are turned off, N1 and RG1 are disconnected, and N2 and RG2 are disconnected;

In the driving phase S1, K1 provides the first clock signal, and in the maintenance phase S2, K1 continues to provide a low voltage signal;

In the maintenance phase S2, R1 provides a low voltage signal, RG1 and RG2 provide a low voltage signal, T01 and T02 are both turned on, N1 and RG1 are connected, and N2 and RG2 are connected to ensure that the potential of N1 and N2 are both a low voltage, so that in the maintenance phase S2, the first output transistor included in the first output circuit 13 and the second output transistor included in the second output circuit 14 are both turned on, to prevent abnormal driving.

In at least one embodiment of the present disclosure, when K1 continues to provide a low voltage signal in the maintenance phase S2, the first output transistor and the second output transistor may both be turned on in the maintenance phase S2, so that O1 outputs the low voltage signal.

Figure 6:
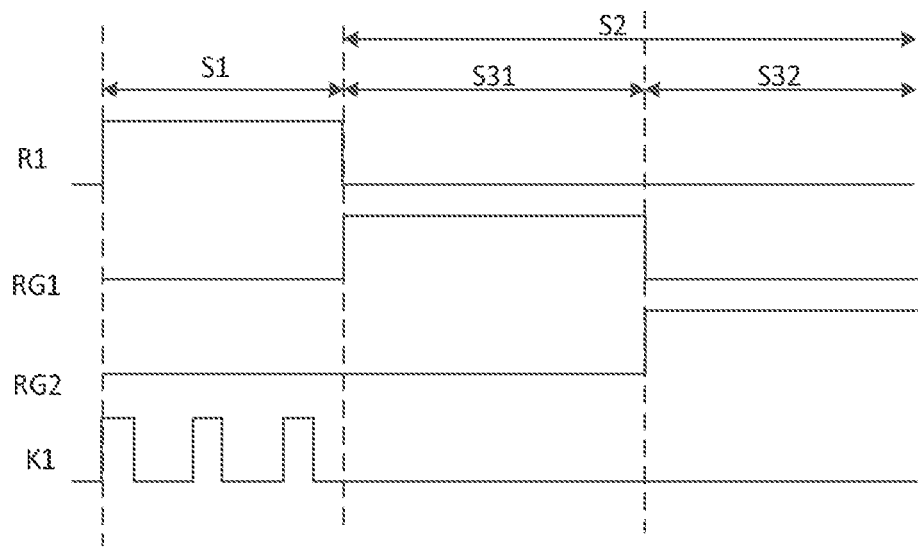
FIG. 6 is a working timing diagram of the driving circuit according to at least one embodiment of the present disclosure.

When at least one embodiment of the driving circuit shown in FIG. 4 of the present disclosure is in operation, as shown in FIG. 6, the driving period includes a driving phase S1 and a maintenance phase S2 set in sequence; the maintenance phase S2 includes a first time period S31 and second time period S32;

In the driving phase S1, R1 provides a high voltage signal, RG1 and RG2 provide a low voltage signal, both T01 and T02 are turned off, N1 and RG1 are disconnected, and N2 and RG2 are disconnected;

In the maintenance phase S2, R1 provides a low voltage signal, both T01 and T02 are turned on, N1 and RG1 are connected, and N2 and RG2 are connected;

In the driving phase S1, K1 provides the first clock signal, and in the maintenance phase S2, K1 continues to provide a low voltage signal;

In the first time period S31, RG1 provides a high voltage signal, RG2 provides a low voltage signal, the potential of N1 is a high voltage, and the potential of N2 is a low voltage, so that the first output transistor included in the first output circuit 13 is turned off, the second output transistor included in the second output circuit 14 is turned on to prevent abnormal driving;

In the second time period S32, RG1 provides a low voltage signal, RG2 provides a high voltage signal, the potential of N1 is a low voltage, and the potential of N2 is a high voltage, so that the first output transistor included in the first output circuit 13 is turned on, the second output transistor included in the second output circuit 14 is turned off to prevent abnormal driving.

When at least one embodiment of the driving circuit shown in FIG. 4 of the present disclosure is in operation, when the low voltage signal is continuously provided by K1 in the maintenance phase S2, at any time point in the maintenance phase S2, the first output transistor or the second output transistor are turned on to achieve the purpose of enabling O1 to continuously output a low voltage signal.

Figure 7:
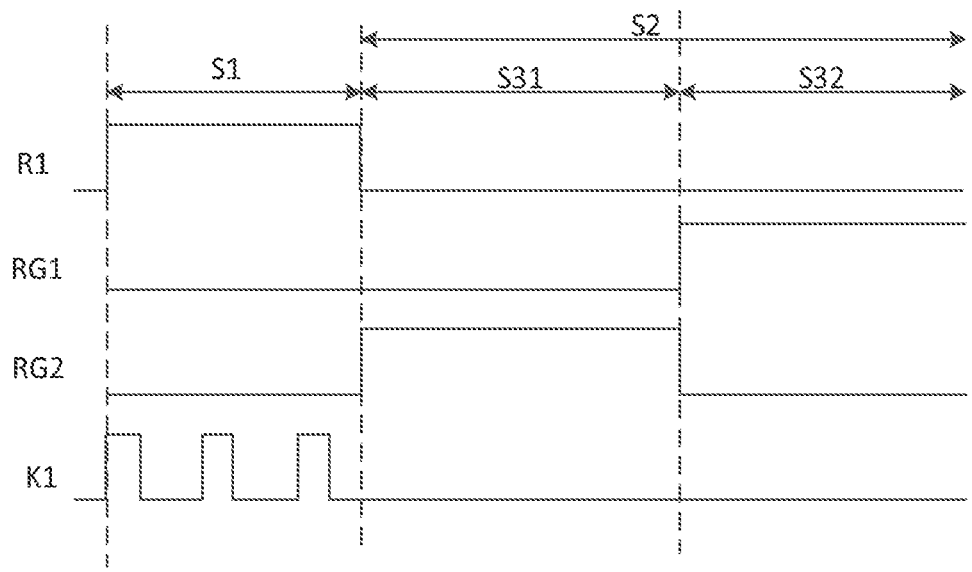
FIG. 7 is a working timing diagram of the driving circuit according to at least one embodiment of the present disclosure.

When at least one embodiment of the driving circuit shown in FIG. 4 of the present disclosure is in operation, as shown in FIG. 7, the driving period includes a driving phase S1 and a maintenance phase S2 that are set in sequence; the maintenance phase S2 includes the first time period S31 and the second time period S32 that are set in sequence;

In the driving phase S1, R1 provides a high voltage signal, RG1 and RG2 provide a low voltage signal, both T01 and T02 are turned off, N1 and RG1 are disconnected, and N2 and RG2 are disconnected;

In the maintenance phase S2, R1 provides a low voltage signal, both T01 and T02 are turned on, N1 and RG1 are connected, and N2 and RG2 are connected;

In the maintenance phase S2, K1 continues to provide a low voltage signal;

In the first time period S31, RG1 provides a low voltage signal, RG2 provides a high voltage signal, the potential of N1 is a low voltage, and the potential of N2 is a high voltage, so that the first output transistor included in the first output circuit 13 is turned on, the second output transistor included in the second output circuit 14 is turned off to prevent abnormal driving;

In the second time period S32, RG1 provides a high voltage signal, RG2 provides a low voltage signal, the potential of N1 is a high voltage, and the potential of N2 is a low voltage, so that the first output transistor included in the first output circuit 13 is turned off, the second output transistor included in the second output circuit 14 is turned on to prevent abnormal driving.

Figure 8:
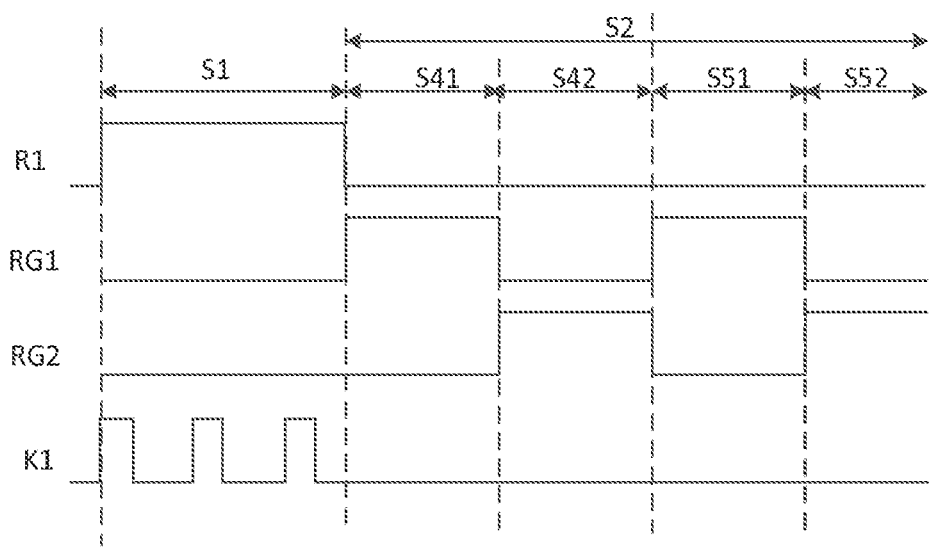
FIG. 8 is a working timing diagram of the driving circuit according to at least one embodiment of the present disclosure.

When at least one embodiment of the driving circuit shown in FIG. 4 of the present disclosure is in operation, as shown in FIG. 8, the driving period includes a driving phase S1 and a maintenance phase S2 set in sequence; the maintenance phase S2 includes a first maintenance stage and a second maintenance stage, the first maintenance stage includes a first third time period S41 and a first fourth time period S42 set in sequence; the second maintenance stage includes a second third time period S51 and a second fourth time period S52;

In the driving phase S1, R1 provides a high voltage signal, RG1 and RG2 provide a low voltage signal, both T01 and T02 are turned off, N1 and RG1 are disconnected, and N2 and RG2 are disconnected;

In the maintenance phase S2, R1 provides a low voltage signal, both T01 and T02 are turned on, N1 and RG1 are connected, and N2 and RG2 are connected;

In the driving phase S1, K1 provides the first clock signal, and in the maintenance phase S2, K1 continues to provide a low voltage signal;

In the first third time period S41 and the second third time period S51, RG1 provides a high voltage signal, RG2 provides a low voltage signal, the potential of N1 is a high voltage, and the potential of N2 is a low voltage, so that the first output transistor included in the first output circuit 13 is turned off, the second output transistor included in the second output circuit 14 is turned on, to prevent abnormal driving;

In the first fourth time period S42 and the second fourth time period S52, RG1 provides a low voltage signal, RG2 provides a high voltage signal, the potential of N1 is a low voltage, and the potential of N2 is a high voltage, so that the first output transistor included in the first output circuit 13 is turned on, the second output transistor included in the second output circuit 14 is turned off, to prevent abnormal driving.

Figure 9:
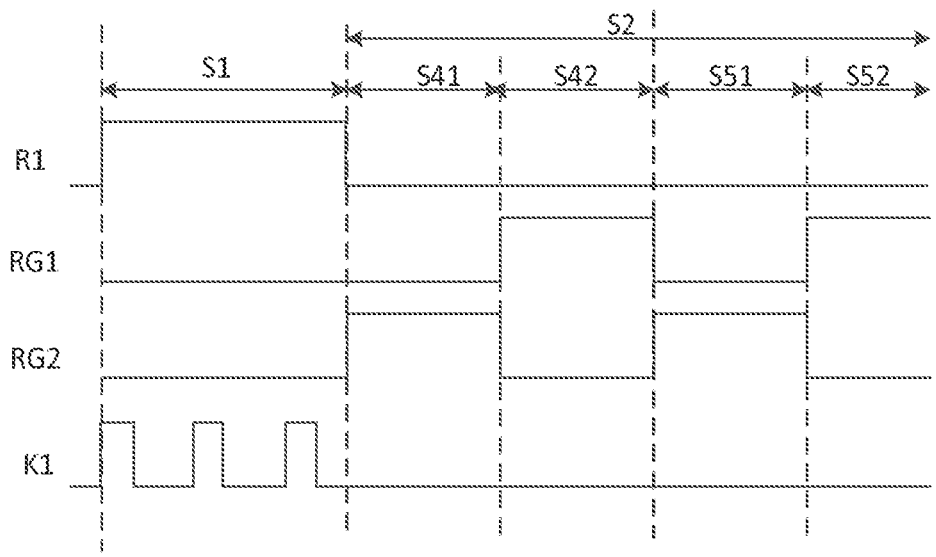
FIG. 9 is a working timing diagram of the driving circuit according to at least one embodiment of the present disclosure.

During operation of at least one embodiment of the driving circuit shown in FIG. 4 of the present disclosure, as shown in FIG. 9, the driving period includes a driving phase S1 and a maintenance phase S2 that are set in sequence; the maintenance phase S2 includes a first maintenance stage and a second maintenance stage, the first maintenance stage includes a first third time period S31 and a first fourth time period S32 set in sequence; the second maintenance stage includes a second third time period S41 and a second a fourth time period S42;

In the driving phase S1, R1 provides a high voltage signal, RG1 and RG2 provide a low voltage signal, both T01 and T02 are turned off, N1 and RG1 are disconnected, and N2 and RG2 are disconnected;

In the maintenance phase S2, R1 provides a low voltage signal, both T01 and T02 are turned on, N1 and RG1 are connected, and N2 and RG2 are connected;

In the driving phase S1, K1 provides the first clock signal, and in the maintenance phase S2, K1 continues to provide a low voltage signal;

In the first third time period S41 and the second third time period S51, RG1 provides a low voltage signal, RG2 provides a high voltage signal, the potential of N1 is a low voltage, and the potential of N2 is a high voltage, so that the first output transistor included in the first output circuit 13 is turned on, the second output transistor included in the second output circuit 14 is turned off to prevent abnormal driving;

In the first fourth time period S42 and the second fourth time period S52, RG1 provides a high voltage signal, RG2 provides a low voltage signal, the potential of N1 is a high voltage, and the potential of N2 is a low voltage, so that the first output transistor included in the first output circuit 13 is turned off, the second output transistor included in the second output circuit 14 is turned on, to prevent abnormal driving.

Optionally, the number of maintenance stages included in the maintenance phase S2 is not limited to two, and may be at least two.

Figure 10:
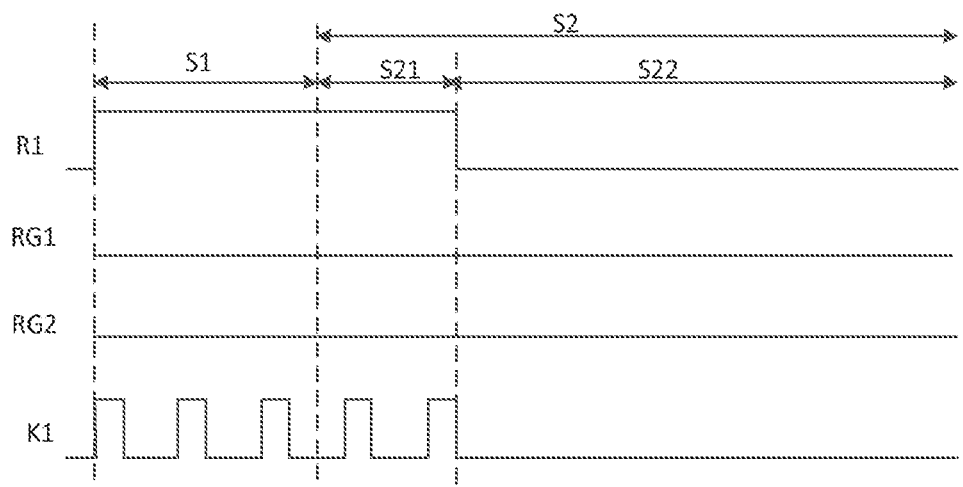
FIG. 10 is a working timing diagram of the driving circuit according to at least one embodiment of the present disclosure.

During operation of at least one embodiment of the driving circuit shown in FIG. 4 of the present disclosure, as shown in FIG. 10, the driving period includes a driving phase S1 and a maintenance phase S2 that are set in sequence; the maintenance phase S2 includes a first maintenance time period S21 and a second maintenance time period S22;

In the driving phase S1, K1 provides a first clock signal, R1 provides a high voltage signal, RG1 and RG2 provide a low voltage signal, T01 and T02 are both turned off, N1 and RG1 are disconnected, and N2 and RG2 are disconnected;

In the first maintenance time period S21, R1 provides a high voltage signal, RG1 and RG2 provide a low voltage signal, both T01 and T02 are turned off, N1 and RG1 are disconnected, and N2 and RG2 are disconnected;

In the driving phase S1 and the first maintenance time period S21, K1 provides a first clock signal;

In the second maintenance time period S22, K1 provides a low voltage signal;

In the second maintenance time period S22, R1 provides a low voltage signal, RG1 and RG2 provide a low voltage signal, T01 and T02 are both turned on, N1 and RG1 are connected, and N2 and RG2 are connected, so as to ensure that the potential of N1 and the potential of N2 are all a low voltage, so that in the maintenance phase S2, the first output transistor included in the first output circuit 13 and the second output transistor included in the second output circuit 14 are both turned on, to prevent abnormal driving.

When at least one embodiment of the driving circuit shown in FIG. 4 of the present disclosure is in operation, when K1 provides the first clock signal in the first maintenance time period S21 and K1 continues to provide the low voltage signal in the second maintenance time period S22, both the first output transistor and the second output transistor may be turned on in the second maintenance time period S22, so that O1 continues to output a low voltage signal.

Figure 11:
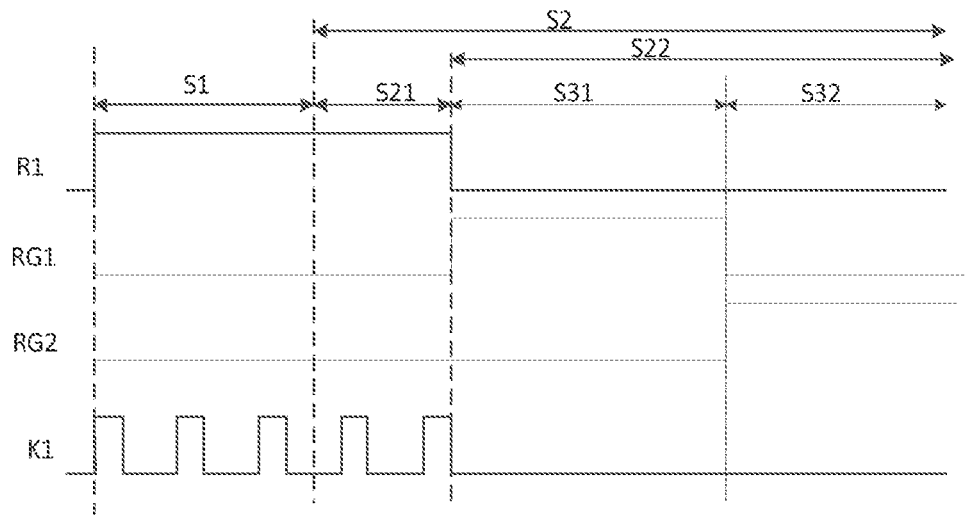
FIG. 11 is a working timing diagram of the driving circuit according to at least one embodiment of the present disclosure.

When at least one embodiment of the driving circuit shown in FIG. 4 of the present disclosure is in operation, as shown in FIG. 11, the driving period includes a driving phase S1 and a maintenance phase S2 set in sequence; the maintenance phase S2 includes a first maintenance time period S21 and a second maintenance time period S22; the second maintenance time period S22 includes a first time period S31 and a second time period S32 set in sequence;

In the driving phase S1, K1 provides a first clock signal, R1 provides a high voltage signal, RG1 and RG2 provide a low voltage signal, T01 and T02 are both turned off, N1 and RG1 are disconnected, and N2 and RG2 are disconnected;

In the first maintenance time period S21, R1 provides a high voltage signal, RG1 and RG2 provide a low voltage signal, both T01 and T02 are turned off, N1 and RG1 are disconnected, and N2 and RG2 are disconnected;

In the driving phase S1 and during the first maintenance time period S21, K1 provides a first clock signal;

In the second maintenance time period S22, K1 provides a low voltage signal;

In the first time period S31, RG1 provides a high voltage signal, RG2 provides a low voltage signal, the potential of N1 is a high voltage, and the potential of N2 is a low voltage, so that the first output transistor included in the first output circuit 13 is turned off, the second output transistor included in the second output circuit 14 is turned on to prevent abnormal driving;

In the second time period S32, RG1 provides a low voltage signal, RG2 provides a high voltage signal, the potential of N1 is a low voltage, and the potential of N2 is a high voltage, so that the first output transistor included in the first output circuit 13 is turned on, the second output transistor included in the second output circuit 14 is turned off to prevent abnormal driving.

When at least one embodiment of the driving circuit shown in FIG. 4 of the present disclosure is in operation, when K1 provides the first clock signal in the first maintenance time period S21 and K1 continues to provide the low voltage signal in the second maintenance time period S22, at any time point in the second maintenance time period S22, the first output transistor or the second output transistor are turned on to achieve the purpose of enabling O1 continue to output a low voltage signal.

In a specific implementation, it can also be controlled that RG1 provides a low voltage signal and RG2 provides a high voltage signal in the first time period S31, and RG1 provides a high voltage signal, and RG2 provides a low voltage signal in the second period S32.

Figure 12:
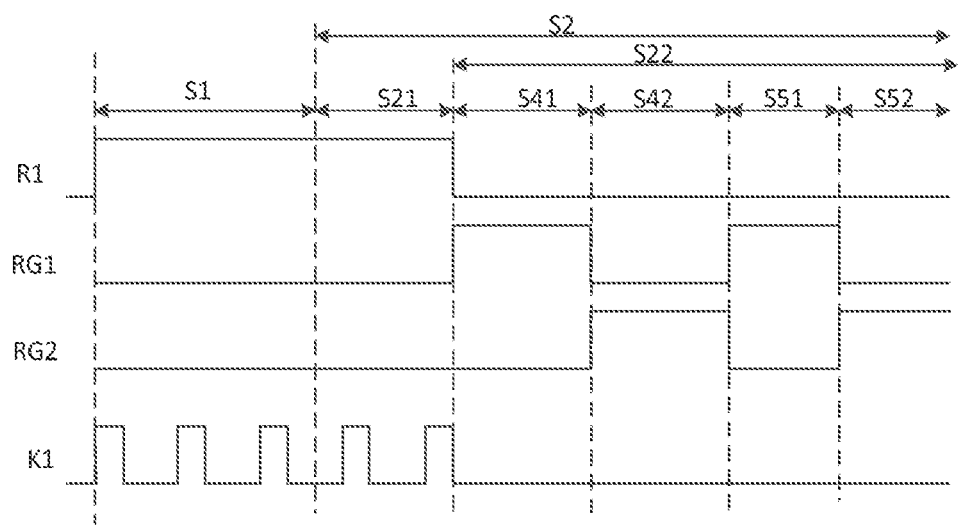
FIG. 12 is a working timing diagram of the driving circuit according to at least one embodiment of the present disclosure.

When at least one embodiment of the driving circuit shown in FIG. 4 of the present disclosure is in operation, as shown in FIG. 12, the driving period includes a driving phase S1 and a maintenance phase S2 that are set in sequence; the maintenance phase S2 includes a first maintenance time period S21 and a second maintenance time period S22 set in sequence; the second maintenance period S22 includes the first maintenance stage and the second maintenance stage set in sequence, and the first maintenance stage includes a first third time period S31 and a first fourth time period S32 set in sequence; the second maintenance stage includes the second third time period S41 and the second fourth time period S42 set in sequence;

In the driving phase S1, K1 provides a first clock signal, R1 provides a high voltage signal, RG1 and RG2 provide a low voltage signal, T01 and T02 are both turned off, N1 and RG1 are disconnected, and N2 and RG2 are disconnected;

In the first maintenance time period S21, R1 provides a high voltage signal, RG1 and RG2 provide a low voltage signal, both T01 and T02 are turned off, N1 and RG1 are disconnected, and N2 and RG2 are disconnected;

In the driving phase S1 and in the first maintenance time period S21, K1 provides a first clock signal;

In the second maintenance time period S22, K1 provides a low voltage signal;

In the first third time period S41 and the second third time period S51, RG1 provides a high voltage signal, RG2 provides a low voltage signal, the potential of N1 is a high voltage, and the potential of N2 is a low voltage, so that the first output transistor included in the first output circuit 13 is turned off, the second output transistor included in the second output circuit 14 is turned on, to prevent abnormal driving;

In the first fourth time period S42 and the second fourth time period S52, RG1 provides a low voltage signal, RG2 provides a high voltage signal, the potential of N1 is a low voltage, and the potential of N2 is a high voltage, so that the first output transistor included in the first output circuit 13 is turned on, the second output transistor included in the second output circuit 14 is turned off, to prevent abnormal driving.

In specific implementations, RG1 may be controlled to provide a low voltage signal, RG2 may be controlled to provide a high voltage signal in each third time period, and RG1 may be controlled to provide a high voltage signal, and RG2 may be controlled to provide a low voltage signal in each fourth time period.

Optionally, the number of maintenance stages included in the second maintenance time period S22 is not limited to two, and may be at least two.

In specific implementation, the driving circuit according to at least one embodiment of the present disclosure further includes a third node control circuit, a second node control circuit, a fourth node control circuit, a sixth node control circuit and a first node control circuit, wherein, The third node control circuit is respectively electrically connected to a first clock signal terminal, a second clock signal terminal, an input terminal and a third node, and is configured to connect or disconnect the third node and the input terminal under the control of the first clock signal provided by the first clock signal terminal and the second clock signal provided by the second clock signal terminal;

The second node control circuit is respectively electrically connected with the second node, the second voltage terminal, a fourth node, a third clock signal terminal and a control node, and is configured to control to connect or disconnect the control node and the second voltage terminal under the control of the potential of the fourth node, and control to connect or disconnect the control node and the third clock signal terminal under the control of the potential of the second node, and control the potential of the second node according to the potential of the control node;

The fourth node control circuit is respectively electrically connected to the first voltage terminal, the second clock signal terminal, the fourth node and the third node, and is configured to control to connect or disconnect the fourth node and the first voltage terminal under the control of the second clock signal, and control to connect or disconnect the fourth node and the second clock signal terminal under the control of the potential of the third node;

The sixth node control circuit is respectively electrically connected to a fifth node, the third clock signal terminal and a sixth node, and is configured to control to connect or disconnect the sixth node and the third clock signal terminal under the control of the potential of the fifth node, and control the potential of the sixth node according to the potential of the fifth node;

The first node control circuit is electrically connected to the sixth node, the third clock signal terminal, the first node, the second node and the first clock signal terminal, and configured to control to connect or disconnect the sixth node and the first node under the control of the third clock signal provided by the third clock signal terminal, and control to connect or disconnect the first node and the first clock signal terminal under the control of the potential of the second node, and control the potential of the first node according to the first clock signal.

Optionally, the second voltage terminal may be a high voltage terminal, but not limited thereto.

In at least one embodiment of the present disclosure, the third node and the second node may be the same node; or, The driving circuit further includes a first on-off control circuit, the first on-off control circuit is electrically connected to the third node, the second node and the first voltage terminal, configured to control to connect the third node and the second node under the control of the first voltage signal provided by the first voltage terminal.

In at least one embodiment of the present disclosure, the fourth node and the fifth node may be the same node; or, The driving circuit further includes a second on-off control circuit, the second on-off control circuit is respectively electrically connected to the fourth node, the fifth node and the first voltage terminal, the second on-off control circuit is configured to control to connect the fourth node and the fifth node under the control of the first voltage signal provided by the first voltage terminal.

In at least one embodiment of the present disclosure, the first on-off control circuit may include a normally-on transistor, the second on-off control circuit may also include a normally-on transistor, and the normally-on transistor included in the first on-off control circuit can prevent the potential of the second node from changing too much by dividing the voltage, and the normally-on transistor included in the second on-off control circuit can prevent the potential of the fifth node from changing too much by dividing the voltage.

Figure 13:
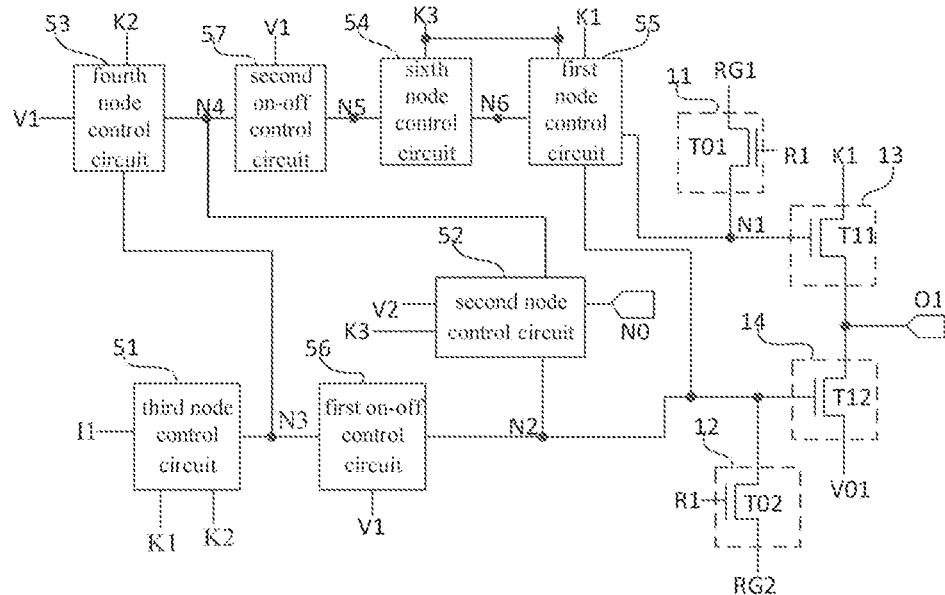
FIG. 13 is a circuit diagram of a driving circuit according to at least one embodiment of the present disclosure.

As shown in FIG. 13, on the basis of at least one embodiment of the driving circuit shown in FIG. 4, at least one embodiment of the driving circuit described in the present disclosure further includes a third node control circuit 51 and a second node control circuit 52, a fourth node control circuit 53, a sixth node control circuit 54, a first node control circuit 55, a first on-off control circuit 56 and a second on-off control circuit 57, wherein, The third node control circuit 51 is respectively electrically connected to the first clock signal terminal K1, the second clock signal terminal K2, the input terminal I1 and the third node N3, and is configured to control to connect or disconnect the third node N3 and the input terminal I1 under the control of the first clock signal provided by the first clock signal terminal K1 and the second clock signal provided by the second clock signal terminal K2;

The second node control circuit 52 is respectively electrically connected to the second node N2, the second voltage terminal V2, the fourth node N4, the third clock signal terminal K3 and the control node N0, is configured to control to connect or disconnect the control node N0 and the second voltage terminal V2 under the control of the potential of the fourth node N4, control to connect or disconnect the control node N0 and the third clock signal terminal K3 under the control of the potential of the second node N2, and control the potential of the second node N2 according to the potential of the control node N0;

The fourth node control circuit 53 is respectively electrically connected to the first voltage terminal V1, the second clock signal terminal K2, the fourth node N4 and the third node N3, and is used to control to connect or disconnect the fourth node N4 and the first voltage terminal V1 under the control of the second clock signal provided by K2, and control to connect or disconnect the fourth node N4 and the second clock signal terminal K2 under the control of the potential of the third node N3;

The sixth node control circuit 54 is respectively electrically connected to the fifth node N5, the third clock signal terminal K3 and the sixth node N6, and is used to control to connect or disconnect the sixth node N6 and the third clock signal terminal K3 under the control of the potential of the fifth node N5, and control the potential of the sixth node N6 according to the potential of the fifth node N5;

The first node control circuit 55 is respectively electrically connected to the sixth node N6, the third clock signal terminal K3, the first node N1, the second node N2 and the first clock signal terminal K1, and is used to control to connect or disconnect the sixth node N6 and the first node N1 under the control of the third clock signal provided by the third clock signal terminal K3, and control to connect or disconnect the first node N1 and the first clock signal terminal K1 under the control of the potential of the second node N2, and control the potential of the first node N1 according to the first clock signal provided by K1;

The first on-off control circuit 56 is respectively electrically connected to the third node N3, the second node N2 and the first voltage terminal V1, and the first on-off control circuit 56 is used to control to connect or disconnect the third node N3 and the second node N2 under the control of the first voltage signal provided by the first voltage terminal V1;

The second on-off control circuit 57 is respectively electrically connected to the fourth node N4, the fifth node N5 and the first voltage terminal V1, and the second on-off control circuit 57 is used to control to connect or disconnect the fourth node N4 and the fifth node N5 under the control of the first voltage signal provided by the first voltage terminal V1.

When at least one embodiment of the driving circuit shown in FIG. 13 of the present disclosure is in operation, the third node control circuit 51 controls the potential of the third node N3 under the control of the first clock signal and the second clock signal, so the second node control circuit 52 controls the potential of the second node N2 according to the third clock signal under the control of the potential of the fourth node N4 and the potential of the second node N2, and the fourth node control circuit 53 controls the potential of the fourth node N4 according to the second clock signal under the control of the second clock signal and the potential of the third node N3, and the sixth node control circuit 54 controls the potential of the sixth node N6 according to the third clock signal under the control of the potential of the fifth node N5, the first node control circuit 55 controls the potential of the first node N1 according to the potential of the sixth node N6 and the first clock signal under the control of the third clock signal and the potential of the second node N2, the first on-off control circuit 56 controls to connect or disconnect the third node N3 and the second node N2 under the control of the first voltage signal, and the second on-off control circuit 57 control to connect or disconnect the fourth node N4 and the fifth node N5 under the control of first voltage signal.

Optionally, the first node control circuit includes a first transistor, a second transistor and a first capacitor;

A control electrode of the first transistor is electrically connected to the third clock signal terminal, a first electrode of the first transistor is electrically connected to the sixth node, and a second electrode of the first transistor is electrically connected to the first node;

A control electrode of the second transistor is electrically connected to the second node, a first electrode of the second transistor is electrically connected to the first clock signal terminal, and a second electrode of the second transistor is electrically connected to the first node;

A first terminal of the first capacitor is electrically connected to the first node, and a second terminal of the first capacitor is electrically connected to the first clock signal terminal;

The second node control circuit includes a third transistor, a fourth transistor and a second capacitor, wherein, A control electrode of the third transistor is electrically connected to the second node, a first electrode of the third transistor is electrically connected to the third clock signal terminal, and a second electrode of the third transistor is electrically connected to the control node;

A control electrode of the fourth transistor is electrically connected to the fourth node, a first electrode of the fourth transistor is electrically connected to the second voltage terminal, and a second electrode of the fourth transistor is electrically connected to the control node;

A first terminal of the second capacitor is electrically connected to the second node, and a second terminal of the second capacitor is electrically connected to the control node.

Optionally, the third node control circuit includes a fifth transistor and a sixth transistor, the fourth node control circuit includes a seventh transistor and an eighth transistor, and the sixth node control circuit includes a ninth transistor and a third capacitor;

A control electrode of the fifth transistor is electrically connected to the first clock signal terminal, and a first electrode of the fifth transistor is electrically connected to the input terminal;

A control electrode of the sixth transistor is electrically connected to the second clock signal terminal, a first electrode of the sixth transistor is electrically connected to a second electrode of the fifth transistor, and the second electrode of the sixth transistor is electrically connected electrically connected to the third node;

A control electrode of the seventh transistor is electrically connected to the second clock signal terminal, a first electrode of the seventh transistor is electrically connected to the first voltage terminal, and a second electrode of the seventh transistor is electrically connected to the fourth node;

A control electrode of the eighth transistor is electrically connected to the third node, a first electrode of the eighth transistor is electrically connected to the second clock signal terminal, and a second electrode of the eighth transistor is electrically connected to the fourth node;

A control electrode of the ninth transistor is electrically connected to the fifth node, a first electrode of the ninth transistor is electrically connected to the third clock signal terminal, and a second electrode of the ninth transistor is electrically connected to the sixth node;

A first terminal of the third capacitor is electrically connected to the fifth node, and a second terminal of the third capacitor is electrically connected to the sixth node.

Figure 14:
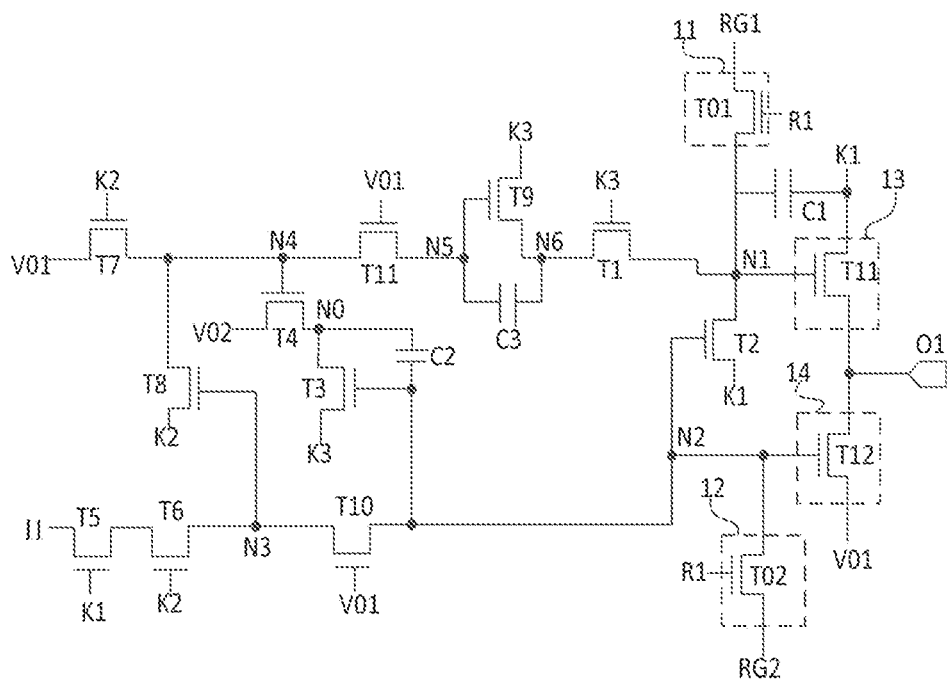
FIG. 14 is a circuit diagram of a driving circuit according to at least one embodiment of the present disclosure.

As shown in FIG. 14, based on at least one embodiment of the driving circuit shown in FIG. 13, the first node control circuit includes a first transistor T1, a second transistor T2 and a first capacitor C1;

The gate electrode of the first transistor T1 is electrically connected to the third clock signal terminal K3, the source electrode of the first transistor T1 is electrically connected to the sixth node N6, and the drain electrode of the first transistor T1 is electrically connected to the first node N1;

The gate electrode of the second transistor T2 is electrically connected to the second node N2, the source electrode of the second transistor T2 is electrically connected to the first clock signal terminal K1, and the drain electrode of the second transistor T2 is electrically connected to the first node N1;

The first terminal of the first capacitor C1 is electrically connected to the first node N1, and the second terminal of the first capacitor C1 is electrically connected to the first clock signal terminal K1;

The second node control circuit includes a third transistor T3, a fourth transistor T4 and a second capacitor C2, wherein, The gate electrode of the third transistor T3 is electrically connected to the second node N2, the source electrode of the third transistor T3 is electrically connected to the third clock signal terminal K3, and the drain electrode of the third transistor T3 is electrically connected to the control node N0;

The gate electrode of the fourth transistor T4 is electrically connected to the fourth node N4, the source electrode of the fourth transistor T4 is electrically connected to the high voltage terminal V02, and the drain electrode of the fourth transistor T4 is electrically connected to the control node N0;

The first terminal of the second capacitor C2 is electrically connected to the second node N2, and the second terminal of the second capacitor C2 is electrically connected to the control node N0;

The third node control circuit includes a fifth transistor T5 and a sixth transistor T6, the fourth node control circuit includes a seventh transistor T7 and an eighth transistor T8, and the sixth node control circuit includes a ninth transistor T9 and a third capacitor C3, where, The gate electrode of the fifth transistor T5 is electrically connected to the first clock signal terminal K1, and the source electrode of the fifth transistor T5 is electrically connected to the input terminal I1;

The gate electrode of the sixth transistor T6 is electrically connected to the second clock signal terminal K2, the source electrode of the sixth transistor is electrically connected to the drain electrode of the fifth transistor T5, and the drain electrode of the sixth transistor T6 is electrically connected to the third node N3;

The gate electrode of the seventh transistor T7 is electrically connected to the second clock signal terminal K2, the source electrode of the seventh transistor T7 is electrically connected to the low voltage terminal V01, and the drain electrode of the seventh transistor T7 is electrically connected to the fourth node N4;

The gate electrode of the eighth transistor T8 is electrically connected to the third node N3, the source electrode of the eighth transistor T8 is electrically connected to the second clock signal terminal K2, and the drain electrode of the eighth transistor T8 is electrically connected to the fourth node N4;

The gate electrode of the ninth transistor T9 is electrically connected to the fifth node N5, the source electrode of the ninth transistor T9 is electrically connected to the third clock signal terminal K3, and the drain electrode of the ninth transistor T9 is electrically connected to the sixth node N6;

The first terminal of the third capacitor C3 is electrically connected to the fifth node N5, and the second terminal of the third capacitor C3 is electrically connected to the sixth node N6;

The first on-off control circuit includes a tenth transistor T10, and the second on-off control circuit includes an eleventh transistor T11;

The gate electrode of the tenth transistor T10 is electrically connected to the low voltage terminal V01, the source electrode of the tenth transistor T10 is electrically connected to the third node N3, and the drain electrode of the tenth transistor T10 is electrically connected to the second node N2;

The gate electrode of the eleventh transistor T11 is electrically connected to the low voltage terminal V01, the source electrode of the eleventh transistor T11 is electrically connected to the fourth node N4, and the drain electrode of the eleventh transistor T11 is electrically connected to the fifth node N5.

In at least one embodiment of the driving circuit shown in FIG. 14, all transistors are p-type thin film transistors, but not limited thereto.

In at least one embodiment of the driving circuit shown in FIG. 14 of the present disclosure, the first voltage terminal is a low voltage terminal V01, and the second voltage terminal is a high voltage terminal V02.

Figure 15:
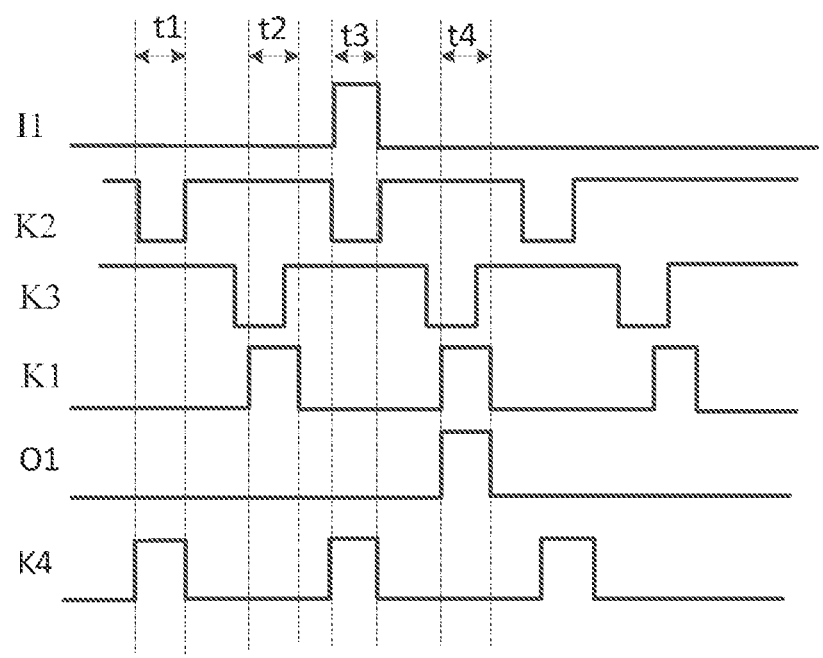
FIG. 15 is a working timing diagram of the driving circuit shown in FIG. 14.

As shown in FIG. 15, when at least one embodiment of the driving circuit shown in FIG. 14 of the present disclosure is in operation, the operating period of the driving circuit may include a first stage t1, a second stage t2, a third stage t3, and a fourth stage t4;

In the first stage t1, I1 provides a low voltage signal, the potential of the first clock signal provided by K1 is a low voltage, the potential of the second clock signal provided by K2 is a low voltage, and the potential of the third clock signal provided by K3 is a high voltage, T7 is turned on, T5 and T6 are turned on, the potential of N3 is a low voltage, T8 is turned on, the potential of N4 is a low voltage, T4 is turned on, the potential of N0 is a high voltage, the potential of N2 is a low voltage, T3 is turned on, and the potential of N5 is a low voltage, T9 is turned on, the potential of N6 is high voltage, T1 is turned off, T2 is turned on, the potential of N1 is a low voltage, T11 and T12 are both turned on, O1 outputs a low voltage signal;

In the second stage t2, I1 provides a low voltage signal, the potential of the first clock signal provided by K1 is a high voltage, the potential of the second clock signal provided by K2 is a high voltage, and the potential of the third clock signal provided by K3 is changed from a low voltage to a high voltage;

In the second stage t2, when the potential of the third clock signal is a low voltage, T6 is turned off, the potential of N3 is maintained at a low voltage, T7 is turned off, T8 is turned on, the potential of N4 is a high voltage, and the potential of N5 is a high voltage, T4 is turned off, the potential of N2 is a low voltage, T2 is turned on, the potential of N1 is a high voltage, T11 is turned off, T12 is turned on, O1 outputs a low voltage signal;

In the third stage t3, I1 provides a high voltage signal, the potential of the first clock signal provided by K1 is a low voltage, the potential of the second clock signal provided by K2 is a low voltage, and the potential of the second clock signal provided by K3 is a high voltage, T7 is turned on, the potential of N4 is a low voltage, the potential of N5 is a low voltage, T5 and T6 are both turned on, the potential of N3 is a high voltage, the potential of N2 is a high voltage, T8 is turned off, T4 is turned on, T3 is turned off, T9 is turned on, the potential of N6 is a high voltage, T1 is turned off, both T11 and T12 are turned off, and O1 keeps outputting a low voltage signal;

In the fourth stage t4, I1 provides a low voltage signal, the potential of the first clock signal provided by K1 is a high voltage, the potential of the second clock signal provided by K2 is a high voltage, and the potential of the third clock signal provided by K3 is changed from a low voltage to a high voltage;

In the fourth stage t4, when the potential of the third clock signal is at a low voltage, T6 is turned off, the potential of N3 is maintained at a high voltage, the potential of N2 is a high voltage, T2 is turned off, T8 is turned off, and T7 is turned off, the potential of N4 is maintained at a low voltage, the potential of N5 is a low voltage, T9 is turned on, the potential of N6 is changed from a low voltage to a high voltage, T1 is turned on, and the potential of N1 becomes −3V (in the fourth stage t4, T1 and T9 are both turned on. Since the p-type thin film transistor has a threshold voltage loss when transmitting a low potential, the potential of N1 becomes −3V). At this time, the potential of the first clock signal is 7V, T11 is turned on, T12 is turned off, and O1 outputs a high voltage Signal.

When at least one embodiment of the driving circuit shown in FIG. 14 of the present disclosure is in operation, In the second stage t2, when the potential of the third clock signal is a high voltage, T1 is turned off, the potential of N1 is maintained at a high voltage, T11 continues to be turned off, the potential of N2 is a low voltage, and T12 continues to be turned on;

In the fourth stage, when the potential of the third clock signal is a high voltage, T1 is turned off, the potential of N1 is maintained at a negative voltage, T11 continues to be turned on, the potential of N2 is a high voltage, and T12 continues to be turned off.

When at least one embodiment of the driving circuit shown in FIG. 14 of the present disclosure is in operation, T11 can be normally turned on to prevent the potential of N2 from changing too much through voltage division, and T12 can be normally turned on to prevent the potential of N5 from changing too much through voltage division.

The driving method described in the embodiment of the present disclosure is applied to the above-mentioned driving circuit, and the driving period includes a driving phase and a maintenance phase; the driving method includes:

In the driving phase, the first clock signal terminal providing the first clock signal, and the driving circuit outputting the driving signal through the first output circuit and the second output circuit; the first control circuit controlling to disconnect the first node and the first control voltage terminal under the control of the control signal provided by the control terminal, and the second control circuit controlling to disconnect the second node and the second control voltage terminal under the control of the control signal;

In at least part of the maintenance phase, the first clock signal terminal providing a first voltage signal;

In the at least part of the maintenance phase, the first control circuit controlling to connect the first node and the first control voltage terminal under the control of the control signal provided by the control terminal, and the second control circuit controlling to connect the second node and the second control voltage terminal under the control of the control signal.

The driving method according to at least one embodiment of the present disclosure adopts the first control circuit and/or the second control circuit, so that in the maintenance phase, when the first clock signal terminal continuously provides the first voltage signal, the potential of the driving signal is not the first voltage signal, the driving signal can be restored to the first voltage signal through the control of the first control circuit and/or the second control circuit, so as to ensure the operation stability of the driving circuit.

Optionally, the driving method described in at least one embodiment of the present disclosure further includes:

In the at least part of the maintenance phase, both the first control voltage terminal and the second control voltage terminal providing a valid voltage signal, so that the first output transistor included in the first output circuit and the second output transistor included in the second output circuit are both turned on, so that the driving circuit outputs the first voltage signal through the output terminal thereof.

In at least one embodiment of the present disclosure, when the first output transistor and the second output transistor are n-type transistors, the valid voltage signal is a high voltage signal, and the invalid voltage signal is a low voltage signal; when the first output transistor and the second output transistor are p-type transistors, the valid voltage signal is a low voltage signal, and the invalid voltage signal is a high voltage signal.

In at least one embodiment of the present disclosure, the at least part of the maintenance phase includes a first time period and a second time period that are set in sequence, and the driving method further includes:

In the first time period, the first control voltage terminal providing a valid voltage signal, and the second control voltage terminal providing an invalid voltage signal; in the second time period, the first control voltage terminal providing an invalid voltage signal, and the second control voltage terminal providing a valid voltage signal, so that the first output transistor is turned off and the second output transistor is turned on; or, In the first time period, the first control voltage terminal providing an invalid voltage signal, and the second control voltage terminal providing a valid voltage signal; in the second time period, the first control voltage terminal providing a valid voltage signal, and the second control voltage terminal provides an invalid voltage signal, so that the first output transistor is turned on and the second output transistor is turned off.

Optionally, the at least part of the maintenance phase includes at least two maintenance stages set in sequence, and each maintenance stage includes a third time period and a fourth time period set in sequence; the driving method further includes:

In the third time period, the first control voltage terminal providing a valid voltage signal, and the second control voltage terminal providing an invalid voltage signal; in the fourth time period, the first control voltage terminal providing an invalid voltage signal, and the second control voltage terminal providing a valid voltage signal, so that the first output transistor is turned off and the second output transistor is turned on; or, In the third time period, the first control voltage terminal providing an invalid voltage signal, and the second control voltage terminal providing a valid voltage signal; in the fourth time period, the first control voltage terminal providing a valid voltage signal, and the second control voltage terminal providing an invalid voltage signal, so that the first output transistor is turned on, and the second output transistor is turned off.

In at least one embodiment of the present disclosure, the step of the first clock signal terminal providing a first voltage signal in at least part of the maintenance phase includes: in part of the maintenance phase, the first clock signal terminal providing the first voltage signal;

The driving method further includes: in a time period other than the part of the maintenance phase in the maintenance phase, the first control circuit controlling to disconnect the first node from the first control voltage terminal under the control of the control signal provided by the control terminal, the second control circuit controlling to disconnect the second node from the second control voltage terminal under the control of the control signal.

The shift register according to the embodiment of the present disclosure includes a plurality levels of the above-mentioned driving circuits.

In at least one embodiment of the present disclosure, an input terminal of the first level of driving circuit in the shift register is connected to a start signal;

Other than the first level of driving circuit, an input terminal of a current level of driving circuit is electrically connected to an output terminal of an adjacent previous level of driving circuit.

In at least one embodiment of the shift register described in the present disclosure, a clock signal connected to a first clock signal terminal of an odd-numbered level of driving circuit may be different from a clock signal connected to a first clock signal terminal of an even-numbered level of driving circuit. For example, when the waveform of the clock signal connected to the first clock signal terminal of the even-numbered level of driving circuit is a waveform corresponding to K1 as shown in FIG. 15, the clock signal connected to the first clock signal terminal of the odd-numbered level of driving circuit can be a waveform corresponding to K4 as shown in FIG. 15 (K4 is the fourth clock signal), but not limited thereto.

The display device according to the embodiment of the present disclosure includes the above-mentioned pixel circuit.

The display device provided by at least one embodiment of the present disclosure may be any product or component with a display function, such as a mobile phone, a tablet computer, a TV, a monitor, a notebook computer, a digital photo frame, and a navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A driving circuit, comprising a first control circuit, a second control circuit, a first output circuit, a second output circuit and an output terminal; wherein
   the first output circuit is electrically connected to a first node, a first clock signal terminal and the output terminal, and is configured to connect or disconnect the output terminal and the first clock signal terminal under the control of a potential of the first node;
   the second output circuit is electrically connected to a second node, the output terminal and a first voltage terminal, and is configured to connect or disconnect the output terminal and the first voltage terminal under the control of a potential of the second node;
   the first control circuit is electrically connected to a control terminal, the first node and a first control voltage terminal, and is configured to connect or disconnect the first node and the first control voltage terminal under the control of a control signal provided by the control terminal;
   the second control circuit is electrically connected to the control terminal, the second node and a second control voltage terminal, and is configured to connect or disconnect the second node and the second control voltage terminal under the control of the control signal,
   the first control voltage terminal and the second control voltage terminal provide a same voltage signal in a first time period, the first control voltage terminal and the second control voltage terminal provide different voltage signals in a second time period.

2. The driving circuit according to claim 1, wherein the first control circuit comprises a first control transistor;
   a control electrode of the first control transistor is electrically connected to the control terminal, a first electrode of the first control transistor is electrically connected to the first control voltage terminal, and a second electrode of the first control transistor is electrically connected to the first node.

3. The driving circuit according to claim 2, wherein the first output circuit includes a first output transistor and the second output circuit includes a second output transistor,
   a control electrode of the first output transistor is electrically connected to the first node, a first electrode of the first output transistor is electrically connected to the first clock signal terminal, and a second electrode of the first output transistor is electrically connected to the output terminal;
   a control electrode of the second output transistor is electrically connected to the second node, a first electrode of the second output transistor is electrically connected to the first voltage terminal, and a second electrode of the second output transistor is electrically connected to the output terminal.

4. The driving circuit according to claim 2, further comprising a third node control circuit, a second node control circuit, a fourth node control circuit, a sixth node control circuit and a first node control circuit, wherein,
   the third node control circuit is electrically connected to a first clock signal terminal, a second clock signal terminal, an input terminal and a third node, and is configured to connect or disconnect the third node and the input terminal under the control of a first clock signal provided by the first clock signal terminal and a second clock signal provided by the second clock signal terminal;
   the second node control circuit is electrically connected to the second node, a second voltage terminal, a fourth node, a third clock signal terminal and a control node, and is configured to control to connect or disconnect the control node and the second voltage terminal under the control of a potential of the fourth node, and control to connect or disconnect the control node and the third clock signal terminal under the control of a potential of the second node, and control the potential of the second node according to the potential of the control node;
   the fourth node control circuit is electrically connected to the first voltage terminal, the second clock signal terminal, the fourth node and the third node, and is configured to control to connect or disconnect the fourth node and the first voltage terminal under the control of the second clock signal, and control to connect or disconnect the fourth node and the second clock signal terminal under the control of a potential of the third node;
   the sixth node control circuit is electrically connected to a fifth node, a third clock signal terminal and a sixth node, and is configured to control to connect or disconnect the sixth node and the third clock signal terminal under the control of a potential of the fifth node, and control a potential of the sixth node according to the potential of the fifth node;
   the first node control circuit is electrically connected to the sixth node, the third clock signal terminal, the first node, the second node and the first clock signal terminal, and configured to control to connect or disconnect the sixth node and the first node under the control of a third clock signal provided by the third clock signal terminal, and control to connect or disconnect the first node and the first clock signal terminal under the control of the potential of the second node, and control the potential of the first node according to the first clock signal.

5. The driving circuit according to claim 1, wherein the second control circuit comprises a second control transistor;
a control electrode of the second control transistor is electrically connected to the control terminal, a first electrode of the second control transistor is electrically connected to the second control voltage terminal, and a second electrode of the second control transistor is electrically connected to the second node.

6. The driving circuit according to claim 5, wherein the first output circuit includes a first output transistor and the second output circuit includes a second output transistor,
a control electrode of the first output transistor is electrically connected to the first node, a first electrode of the first output transistor is electrically connected to the first clock signal terminal, and a second electrode of the first output transistor is electrically connected to the output terminal;
a control electrode of the second output transistor is electrically connected to the second node, a first electrode of the second output transistor is electrically connected to the first voltage terminal, and a second electrode of the second output transistor is electrically connected to the output terminal.

7. The driving circuit according to claim 5, further comprising a third node control circuit, a second node control circuit, a fourth node control circuit, a sixth node control circuit and a first node control circuit, wherein,
the third node control circuit is electrically connected to a first clock signal terminal, a second clock signal terminal, an input terminal and a third node, and is configured to connect or disconnect the third node and the input terminal under the control of a first clock signal provided by the first clock signal terminal and a second clock signal provided by the second clock signal terminal;
the second node control circuit is electrically connected to the second node, a second voltage terminal, a fourth node, a third clock signal terminal and a control node, and is configured to control to connect or disconnect the control node and the second voltage terminal under the control of a potential of the fourth node, and control to connect or disconnect the control node and the third clock signal terminal under the control of a potential of the second node, and control the potential of the second node according to the potential of the control node;
the fourth node control circuit is electrically connected to the first voltage terminal, the second clock signal terminal, the fourth node and the third node, and is configured to control to connect or disconnect the fourth node and the first voltage terminal under the control of the second clock signal, and control to connect or disconnect the fourth node and the second clock signal terminal under the control of a potential of the third node;
the sixth node control circuit is electrically connected to a fifth node, a third clock signal terminal and a sixth node, and is configured to control to connect or disconnect the sixth node and the third clock signal terminal under the control of a potential of the fifth node, and control a potential of the sixth node according to the potential of the fifth node;
the first node control circuit is electrically connected to the sixth node, the third clock signal terminal, the first node, the second node and the first clock signal terminal, and configured to control to connect or disconnect the sixth node and the first node under the control of a third clock signal provided by the third clock signal terminal, and control to connect or disconnect the first node and the first clock signal terminal under the control of the potential of the second node, and control the potential of the first node according to the first clock signal.

8. The driving circuit according to claim 1, wherein the first output circuit includes a first output transistor and the second output circuit includes a second output transistor,
a control electrode of the first output transistor is electrically connected to the first node, a first electrode of the first output transistor is electrically connected to the first clock signal terminal, and a second electrode of the first output transistor is electrically connected to the output terminal;
a control electrode of the second output transistor is electrically connected to the second node, a first electrode of the second output transistor is electrically connected to the first voltage terminal, and a second electrode of the second output transistor is electrically connected to the output terminal.

9. The driving circuit according to claim 1, further comprising a third node control circuit, a second node control circuit, a fourth node control circuit, a sixth node control circuit and a first node control circuit, wherein,
the third node control circuit is electrically connected to a first clock signal terminal, a second clock signal terminal, an input terminal and a third node, and is configured to connect or disconnect the third node and the input terminal under the control of a first clock signal provided by the first clock signal terminal and a second clock signal provided by the second clock signal terminal;
the second node control circuit is electrically connected to the second node, a second voltage terminal, a fourth node, a third clock signal terminal and a control node, and is configured to control to connect or disconnect the control node and the second voltage terminal under the control of a potential of the fourth node, and control to connect or disconnect the control node and the third clock signal terminal under the control of a potential of the second node, and control the potential of the second node according to the potential of the control node;
the fourth node control circuit is electrically connected to the first voltage terminal, the second clock signal terminal, the fourth node and the third node, and is configured to control to connect or disconnect the fourth node and the first voltage terminal under the control of the second clock signal, and control to connect or disconnect the fourth node and the second clock signal terminal under the control of a potential of the third node;
the sixth node control circuit is electrically connected to a fifth node, a third clock signal terminal and a sixth node, and is configured to control to connect or disconnect the sixth node and the third clock signal terminal under the control of a potential of the fifth node, and control a potential of the sixth node according to the potential of the fifth node;

the first node control circuit is electrically connected to the sixth node, the third clock signal terminal, the first node, the second node and the first clock signal terminal, and configured to control to connect or disconnect the sixth node and the first node under the control of a third clock signal provided by the third clock signal terminal, and control to connect or disconnect the first node and the first clock signal terminal under the control of the potential of the second node, and control the potential of the first node according to the first clock signal.

10. The driving circuit according to claim 9, wherein the third node and the second node are a same node; or,
the driving circuit further includes a first on-off control circuit, the first on-off control circuit is electrically connected to the third node, the second node and the first voltage terminal, configured to control to connect the third node and the second node under the control of the first voltage signal provided by the first voltage terminal.

11. The driving circuit according to claim 9, wherein the fourth node and the fifth node are a same node; or,
the driving circuit further includes a second on-off control circuit, the second on-off control circuit is electrically connected to the fourth node, the fifth node and the first voltage terminal, the second on-off control circuit is configured to control to connect the fourth node and the fifth node under the control of the first voltage signal provided by the first voltage terminal.

12. The driving circuit according to claim 9, wherein the first node control circuit comprises a first transistor, a second transistor and a first capacitor;
a control electrode of the first transistor is electrically connected to the third clock signal terminal, a first electrode of the first transistor is electrically connected to the sixth node, and a second electrode of the first transistor is electrically connected to the first node;
a control electrode of the second transistor is electrically connected to the second node, a first electrode of the second transistor is electrically connected to the first clock signal terminal, and a second electrode of the second transistor is electrically connected to the first node;
a first terminal of the first capacitor is electrically connected to the first node, and a second terminal of the first capacitor is electrically connected to the first clock signal terminal;
the second node control circuit includes a third transistor, a fourth transistor and a second capacitor,
a control electrode of the third transistor is electrically connected to the second node, a first electrode of the third transistor is electrically connected to the third clock signal terminal, and a second electrode of the third transistor is electrically connected to the control node;
a control electrode of the fourth transistor is electrically connected to the fourth node, a first electrode of the fourth transistor is electrically connected to the second voltage terminal, and a second electrode of the fourth transistor is electrically connected to the control node;
a first terminal of the second capacitor is electrically connected to the second node, and a second terminal of the second capacitor is electrically connected to the control node.

13. The driving circuit according to claim 9, wherein the third node control circuit includes a fifth transistor and a sixth transistor, the fourth node control circuit includes a seventh transistor and an eighth transistor, and the sixth node control circuit includes a ninth transistor and a third capacitor;
a control electrode of the fifth transistor is electrically connected to the first clock signal terminal, and a first electrode of the fifth transistor is electrically connected to the input terminal;
a control electrode of the sixth transistor is electrically connected to the second clock signal terminal, a first electrode of the sixth transistor is electrically connected to a second electrode of the fifth transistor, and a second electrode of the sixth transistor is electrically connected electrically connected to the third node;
a control electrode of the seventh transistor is electrically connected to the second clock signal terminal, a first electrode of the seventh transistor is electrically connected to the first voltage terminal, and a second electrode of the seventh transistor is electrically connected to the fourth node;
a control electrode of the eighth transistor is electrically connected to the third node, a first electrode of the eighth transistor is electrically connected to the second clock signal terminal, and a second electrode of the eighth transistor is electrically connected to the fourth node;
a control electrode of the ninth transistor is electrically connected to the fifth node, a first electrode of the ninth transistor is electrically connected to the third clock signal terminal, and a second electrode of the ninth transistor is electrically connected to the sixth node;
a first terminal of the third capacitor is electrically connected to the fifth node, and a second terminal of the third capacitor is electrically connected to the sixth node.

14. A shift register comprising a plurality of levels of driving circuits according to claim 1.

15. A display device comprising the shift register according to claim 14.

16. A driving method, applied to a driving circuit, wherein the driving circuit includes a first control circuit, a second control circuit, a first output circuit, a second output circuit and an output terminal;
the first output circuit is electrically connected to a first node, a first clock signal terminal and the output terminal, and is configured to connect or disconnect the output terminal and the first clock signal terminal under the control of a potential of the first node;
the second output circuit is electrically connected to a second node, the output terminal and a first voltage terminal, and is configured to connect or disconnect the output terminal and the first voltage terminal under the control of a potential of the second node;
the first control circuit is electrically connected to a control terminal, the first node and a first control voltage terminal, and is configured to connect or disconnect the first node and the first control voltage terminal under the control of a control signal provided by the control terminal;
the second control circuit is electrically connected to the control terminal, the second node and a second control voltage terminal, and is configured to connect or disconnect the second node and the second control voltage terminal under the control of the control signal,
wherein a driving period includes a driving phase and a maintenance phase; the driving method comprises:
in the driving phase, the first clock signal terminal providing a first clock signal, and the driving circuit outputting a driving signal through the first output circuit and the second output circuit; the first control circuit controlling to disconnect the first node and the first control voltage terminal under the control of a control signal provided by the control terminal, and the second control circuit controlling to disconnect the second node and the second control voltage terminal under the control of the control signal;

in at least part of the maintenance phase, the first clock signal terminal providing a first voltage signal;

in the at least part of the maintenance phase, the first control circuit controlling to connect the first node and the first control voltage terminal under the control of the control signal provided by the control terminal, and the second control circuit controlling to connect the second node and the second control voltage terminal under the control of the control signal, wherein the at least part of the maintenance phase includes a first time period and a second time period that are set in sequence, and the driving method further includes:

in the first time period, the first control voltage terminal providing a valid voltage signal, and the second control voltage terminal providing an invalid voltage signal; in the second time period, the first control voltage terminal providing an invalid voltage signal, and the second control voltage terminal providing a valid voltage signal; or, in the first time period, the first control voltage terminal providing an invalid voltage signal, and the second control voltage terminal providing a valid voltage signal; in the second time period, the first control voltage terminal providing a valid voltage signal, and the second control voltage terminal provides an invalid voltage signal.

17. The driving method according to claim 16, further comprising:

in the at least part of the maintenance phase, both the first control voltage terminal and the second control voltage terminal providing a valid voltage signal.

18. The driving method according to claim 16, wherein the step of the first clock signal terminal providing a first voltage signal in the at least part of the maintenance phase includes: in part of the maintenance phase, the first clock signal terminal providing the first voltage signal;

the driving method further includes: in a time period other than the part of the maintenance phase in the maintenance phase, the first control circuit controlling to disconnect the first node and the first control voltage terminal under the control of the control signal provided by the control terminal, the second control circuit controlling to disconnect the second node and the second control voltage terminal under the control of the control signal.

19. A driving method, applied to a driving circuit, wherein the driving circuit includes a first control circuit, a second control circuit, a first output circuit, a second output circuit and an output terminal;

the first output circuit is electrically connected to a first node, a first clock signal terminal and the output terminal, and is configured to connect or disconnect the output terminal and the first clock signal terminal under the control of a potential of the first node;

the second output circuit is electrically connected to a second node, the output terminal and a first voltage terminal, and is configured to connect or disconnect the output terminal and the first voltage terminal under the control of a potential of the second node;

the first control circuit is electrically connected to a control terminal, the first node and a first control voltage terminal, and is configured to connect or disconnect the first node and the first control voltage terminal under the control of a control signal provided by the control terminal;

the second control circuit is electrically connected to the control terminal, the second node and a second control voltage terminal, and is configured to connect or disconnect the second node and the second control voltage terminal under the control of the control signal, wherein a driving period includes a driving phase and a maintenance phase; the driving method comprises:

in the driving phase, the first clock signal terminal providing a first clock signal, and the driving circuit outputting a driving signal through the first output circuit and the second output circuit; the first control circuit controlling to disconnect the first node and the first control voltage terminal under the control of a control signal provided by the control terminal, and the second control circuit controlling to disconnect the second node and the second control voltage terminal under the control of the control signal;

in at least part of the maintenance phase, the first clock signal terminal providing a first voltage signal;

in the at least part of the maintenance phase, the first control circuit controlling to connect the first node and the first control voltage terminal under the control of the control signal provided by the control terminal, and the second control circuit controlling to connect the second node and the second control voltage terminal under the control of the control signal, wherein the at least part of the maintenance phase includes at least two maintenance stages set in sequence, and each maintenance stage includes a third time period and a fourth time period set in sequence; the driving method further includes:

in the third time period, the first control voltage terminal providing a valid voltage signal, and the second control voltage terminal providing an invalid voltage signal; in the fourth time period, the first control voltage terminal providing an invalid voltage signal, and the second control voltage terminal providing a valid voltage signal; or, in the third time period, the first control voltage terminal providing an invalid voltage signal, and the second control voltage terminal providing a valid voltage signal; in the fourth time period, the first control voltage terminal providing a valid voltage signal, and the second control voltage terminal providing an invalid voltage signal.

\* \* \* \* \*